United States Patent
Needham

(10) Patent No.: US 9,634,198 B2
(45) Date of Patent: Apr. 25, 2017

(54) QUANTUM DOT CHIP ON BOARD

(71) Applicant: Nanoco Technologies, Ltd., Manchester (GB)

(72) Inventor: Dale Needham, Manchester (GB)

(73) Assignee: Nanoco Technologies Ltd., Manchester (GB)

(*) Notice: Subject to any disclaimer, the term of this patent is extended or adjusted under 35 U.S.C. 154(b) by 0 days.

(21) Appl. No.: 14/603,982

(22) Filed: Jan. 23, 2015

(65) Prior Publication Data

US 2015/0221834 A1    Aug. 6, 2015

Related U.S. Application Data

(60) Provisional application No. 61/930,839, filed on Jan. 23, 2014.

(51) Int. Cl.
| | | |
|---|---|---|
| H01L 33/00 | (2010.01) | |
| H01L 33/50 | (2010.01) | |
| H01L 25/075 | (2006.01) | |
| H01L 33/58 | (2010.01) | |

(52) U.S. Cl.
CPC ........ *H01L 33/502* (2013.01); *H01L 25/0753* (2013.01); *H01L 33/507* (2013.01); *H01L 33/58* (2013.01); *H01L 2924/0002* (2013.01)

(58) Field of Classification Search
CPC .......... H01L 33/0004–33/648; H01L 25/0753
See application file for complete search history.

(56) References Cited

U.S. PATENT DOCUMENTS

| | | | |
|---|---|---|---|
| 7,588,828 B2 | 9/2009 | Mushtaq et al. | |
| 7,803,423 B2 | 9/2010 | O'Brien et al. | |
| 7,985,446 B2 | 7/2011 | O'Brien et al. | |
| 8,062,703 B2 | 11/2011 | O'Brien et al. | |
| 2009/0224177 A1* | 9/2009 | Kinomoto | C09K 11/7721 250/484.4 |
| 2009/0278151 A1* | 11/2009 | Kim | H01L 33/507 257/98 |
| 2011/0108799 A1* | 5/2011 | Pickett | B82Y 30/00 257/14 |
| 2011/0254039 A1* | 10/2011 | Kim | H01L 33/46 257/98 |
| 2013/0175558 A1 | 7/2013 | Orsley et al. | |
| 2014/0246689 A1* | 9/2014 | Luo | H01L 33/504 257/98 |
| 2015/0078004 A1* | 3/2015 | Harbers | F21V 3/0409 362/293 |

FOREIGN PATENT DOCUMENTS

| | | |
|---|---|---|
| EP | 2644020 A1 | 2/2013 |
| EP | 2669350 A1 | 4/2013 |
| WO | 2012132232 A1 | 4/2012 |
| WO | 2013061511 | 5/2013 |
| WO | 2013114254 A2 | 8/2013 |
| WO | 2013114308 A1 | 8/2013 |

\* cited by examiner

*Primary Examiner* — Cuong B Nguyen
(74) *Attorney, Agent, or Firm* — Blank Rome, LLP

(57) ABSTRACT

Quantum dots used to modify the spectral output of an LED exhibit less of a performance decrease (due to increased temperature) when incorporated in a chip on board (COB) as compared to conventional LED packages. A ceramic ring may be used to shield the quantum dots from the heat associated with connecting electrical leads to pads on the COB. The upper surface of the ceramic ring may be sealed with a glass disk or other transparent material.

19 Claims, 4 Drawing Sheets

QUANTUM DOT CHIP ON BOARD

CROSS-REFERENCE TO RELATED APPLICATIONS

This application claims the benefit of U.S. Provisional Application No. 61/930,839 filed on Jan. 23, 2014.

STATEMENT REGARDING FEDERALLY SPONSORED RESEARCH OR DEVELOPMENT

Not Applicable

BACKGROUND OF THE INVENTION

1. Field of the Invention

The present invention generally relates to light emitting diodes (LEDs). More particularly, it relates to LEDs incorporating fluorescent materials in the form of quantum dot (QD) nanoparticles.

2. Description of the Related Art Including Information Disclosed Under 37 CFR 1.97 and 1.98

Light emitting diodes (LEDs) have become a popular source for lighting because they use less energy than traditional incandescent light sources. Dual in-line package light emitting diodes (DIP-LED) and surface mounted diodes (SMD-LED) are two, popular, modern forms of LED packaging. However, these forms suffer from insufficient power density for some applications. Additionally, it is desirable to have LED devices in smaller sizes than provided by those configurations.

Chip on board LED (COB-LED) offers an alternative to DIP-LED and SMDLED packaging. COB lighting provides the highest power density currently available in an LED device. Furthermore, the device may be manufactured in a small and flat form factor. COB-LEDs are manufactured by attaching LED semiconductor chips directly to printed circuit boards. Directly connecting LEDs provides thermal management, high packaging density, and long life with high performance.

LEDs do not emit white light. Therefore, if an LED is to be used as a white light source, the light emission of the LED must be conditioned using some additional phosphor. The first example of a white LED used a blue LED, a yellow LED, and a $Y_3Al_5O_{12}$:Ce (YAG) phosphor coating. The emission frequencies of the LEDs, combined with the secondary emission from the phosphor, yields white light as perceived by the human eye. Unfortunately, the white light produced by this combination is perceived as cold and artificial and therefore, unpleasant to some people. Subsequently, many different phosphors have been used in an attempt to generate white light more closely resembling the light produced by traditional incandescent bulbs. On potential avenue is coating these LEDs with nanocrystal semiconductors, also known as quantum dots, that, in combination, emit white light instead of traditional phosphors.

Quantum dots are semiconductor nanoparticles having dimensions on the order of 2-10 nm. There is substantial interest in incorporating quantum dots into products because of their size-dependent, fluorescent properties. To date, the majority of quantum dot formulations have been made of II-VI materials, namely, ZnS, ZnSe, CdS, CdTe; and most commonly CdSe due to its tunability over the entire visible spectrum. As mentioned earlier, quantum dots are of academic and commercial interest due to their properties which differ from properties of corresponding crystalline bulk forms of the same semiconductor material.

Two fundamental factors are responsible for the unique properties of quantum dots. First, the surface-area-to-volume ratio of quantum dots is relatively large. As a particle becomes smaller, the ratio of the number of surface atoms to those in the interior increases. This is important because the surface properties of the particle play a larger role in the overall properties of the nanoparticle than in macro particles. The second factor is that, with semiconductor nanoparticles, there is a change in the electronic properties of the material with the size of the particle. Specifically, the band gap gradually becomes wider as the size of the particle decreases. This change in band gap is because of quantum confinement effects. This effect is a consequence of the confinement of an 'electron in a box'; giving rise to discrete energy levels similar to those observed in atoms and molecules rather than corresponding macrocrystalline material. This leads to the important luminescent property of quantum dots: narrow bandwidth emission that is dependent upon particle size and composition.

The emission frequency of a quantum dot is inversely related to the dot's diameter. Therefore, as a quantum dot increases in size, the frequency of emission decreases and, in the inverse, as quantum dots decrease in size emission frequency increases. Because quantum dots can be manufactured with different diameters, quantum dots can be "tuned" to emit electromagnetic radiation in the various colors of the visible spectrum.

BRIEF SUMMARY OF THE INVENTION

Quantum dots used to modify the spectral output of an LED exhibit less of a performance decrease (due to increased temperature) when in a chip on board (COB) configuration as compared to conventional LED packages.

In certain embodiments of the invention, a ceramic ring is used to shield the quantum dots from the heat associated with connecting electrical leads to pads on the COB.

BRIEF DESCRIPTION OF THE SEVERAL VIEWS OF THE DRAWING(S)

DETAILED DESCRIPTION OF THE INVENTION

Figure 1:
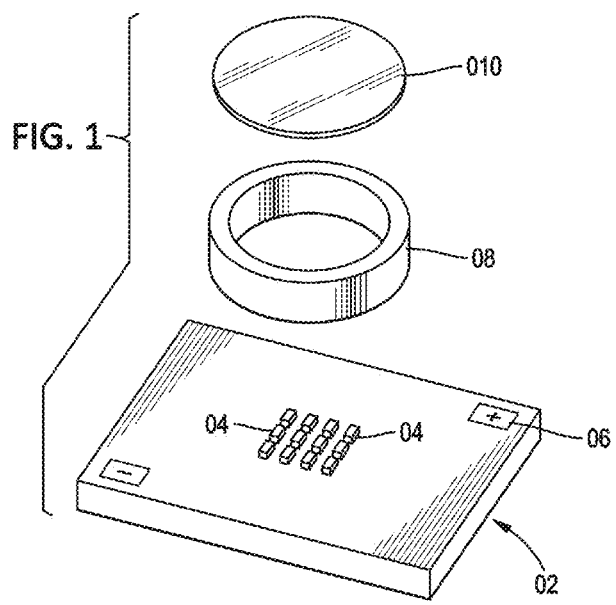
FIG. 1 is an exploded view of a quantum dot chip on board according to the invention.

Any particular method may be employed to produce the semiconductor nanoparticles employed by the present COB-LED. However, it is preferred that the semiconductor nanoparticles be produced by converting a nanoparticle precursor composition to the material of the nanoparticles in the presence of a molecular cluster compound under conditions permitting seeding and growth of the nanoparticles on the cluster compound. The method may employ the methodology disclosed in U.S. Pat. Nos. 7,588,828, 7,803,423, 7,985, 446, and 8,062,703; the entire contents of these publications are hereby incorporated by reference in their entireties.

The coordination about the final inorganic surface atoms in any core, core-shell or core-multi shell, doped or graded nanoparticle is typically incomplete, with highly reactive, non-fully coordinated atoms acting as "dangling bonds" on the surface of the particle, which can lead to particle agglomeration. This problem is typically overcome by passivating (capping) the "bare" surface atoms with protecting organic groups.

In many cases, the capping agent is the solvent in which the nanoparticles have been prepared and consists of a Lewis base compound, or a Lewis base compound diluted in an inert solvent such as a hydrocarbon. There is a lone pair of electrons on the Lewis base capping agent that are capable of a donor type coordination to the surface of the nanoparticle; ligands of this kind include, but are not limited to, mono- or multi-dentate ligands such as phosphines (trioctylphosphine, triphenylphosphine, t-butylphosphine etc.), phosphine oxides (trioctylphosphine oxide, triphenylphosphine oxide etc.), alkyl phosphonic acids, alkyl-amines (hexadecylamine, octylamine etc.), aryl-amines, pyridines, long chain fatty acids and thiophenes In addition to the outermost layer of organic material or sheath material (capping agent) helping to inhibit nanoparticle-nanoparticle aggregation, this layer may also protect the nanoparticles from their surrounding electronic and chemical environments, and provide a means of chemical linkage to other inorganic, biological or organic material, whereby the functional group is pointing away from the nanoparticle surface and is available to bond/react/interact with other available molecules. Examples include, but are not limited to, amines, alcohols, carboxylic acids, esters, acid chloride, anhydrides, ethers, alkyl halides, amides, alkenes, alkanes, alkynes, allenes, amino acids, azides, groups etc. The outermost layer (capping agent) of a quantum dot may also consist of a coordinated ligand that processes a functional group that is polymerizable and may be used to form a polymer layer around the nanoparticle. The outermost layer may also consist of organic units that are directly bonded to the outermost inorganic layer such as via a disulfide bond between the inorganic surface (e.g., ZnS) and a thiol capping molecule. These may also possess additional functional group(s), not bonded to the surface of the particle, which may be used to form a polymer around the particle, or for further reaction/interaction/chemical linkage.

It may be useful to incorporate quantum dots into a primary matrix material forming beads. The primary matrix material is preferably an optically transparent medium, i.e., a medium through which light may pass, and which may be, but does not have to be, substantially optically clear. The primary matrix material, may be a resin, polymer, monolith, glass, sol gel, epoxy, silicone, (meth)acrylate or the like, or may include silica.

Any appropriate method may be used for incorporating the quantum dots into the primary matrix material for bead formation. One method involves incorporating the quantum dots directly into the monomer solution during bead formation. Afterwards, the monomer solution may be polymerized using any appropriate method resulting in the quantum dots being randomly dispersed within the polymer. In an alternative procedure, a ligand exchange process may be carried out prior to the bead forming reaction. Quantum dots may be used as isolated from the reaction employed to synthesize them and are thus generally coated with an inert outer organic ligand layer. Here one or more chemically reactive ligands (for example, this may be a ligand for the quantum dots which also contains a polymerizable moiety) are added in excess to a solution of nascent quantum dots coated in an inert outer organic layer. After appropriate incubation time, the quantum dots are isolated, for example by precipitation and subsequent centrifugation, washed and then incorporated into the mixture of reagents used in the bead forming reaction/process. Thereafter, during polymerization, the randomly dispersed quantum dots are covalently bonded into the polymer.

Another option for incorporating quantum dots into beads involves directly depositing them into primary particles. For example, a solution of quantum dots in a suitable solvent (e.g. organic solvent) may be incubated with a sample of primary particles. Subsequent removal of the solvent leaves the quantum dots immobilized within the matrix material of the primary particles. Additionally, one or more stability enhancing additives may be added.

Once quantum dots are incorporated into a primary matrix, one may want to provide an additional layer of an inorganic material on the quantum dot-containing primary particles, such as a metal oxide or metal nitride. One particularly effective method to add such a layer is Atomic Layer Deposition (ALD), although other suitable techniques may be employed.

White light has been produced using quantum dots by utilizing a blue LED in conjunction with red and green quantum dots. When some of the emission of the blue LED is absorbed and emitted by the green and red quantum dots, the resultant mix appears white. The present invention is directed to overcoming, or at least reducing the effects of, one or more of the problems set forth above.

FIG. 1 illustrates a printed circuit board (02) that forms the base for a QD-COB. On top of the printed circuit board, LED lights (04) (the "chips") are attached using methods commonly understood in the art. This forms a traditional COB-LED. Once the LEDs are attached, they need to be encapsulated in some manner so that additional layers may be added to the printed circuit board. In an embodiment, a ceramic ring (08) is attached to the printed circuit board (PCB) with the LEDs in the middle. A layer of LED encapsulant, such as silicone, is applied on top of the LEDs inside the encapsulating ring.

Once the LEDs are covered with silicone, they may be covered by any matrix containing quantum dots. The matrix material may be a resin, polymer, monolith, glass, sol gel, epoxy, silicone, (meth)acrylate or the like, or may include silica. The quantum dots suspended in the matrix material may be nascent quantum dots or bead quantum dots. Once the quantum dots are incorporated on the COB-LED, the dots may be capped, for example, by using a circular glass disc (010) and resin to bond the glass to the ceramic package. There are many ways in which the dots suspended on the package may be capped.

Figure 2:
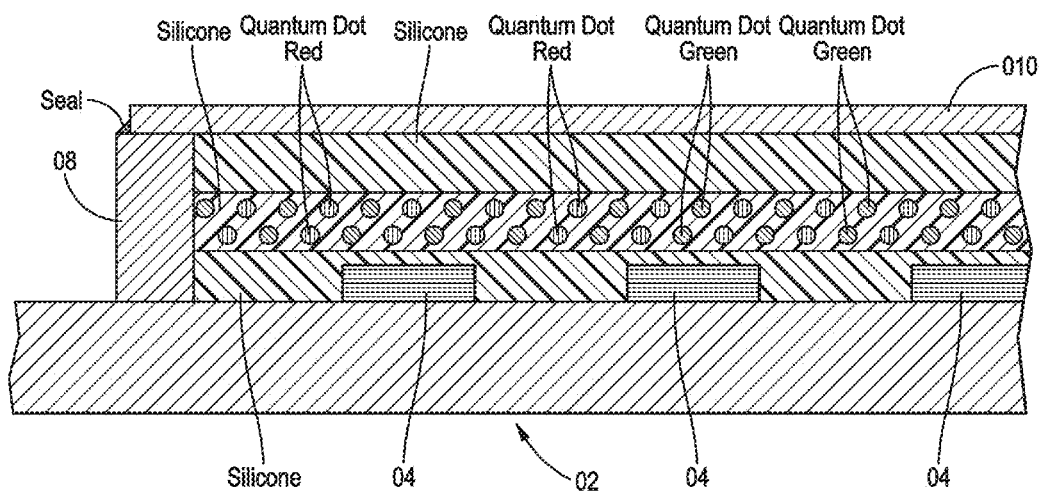
FIG. 2 is a cross-sectional view of the assembled device illustrated in FIG. 1.

It is known that quantum dots degrade at high temperatures. In order to protect the dots from extreme heat while attaching wires to the COB (06), a device has been produced that attaches to the pads of the COB while having the ability to connect the wires to the solder pads. The wires are not soldered in the vicinity of the LED/quantum dot assembly. As such, the quantum dots are not exposed to the soldering heat during soldering. A view of the assembled device is illustrated in FIG. 2.

To prevent quantum dot degradation during operation, the drive current on the COB is kept lower than would typically be used to produce maximum output.

Figure 3A:
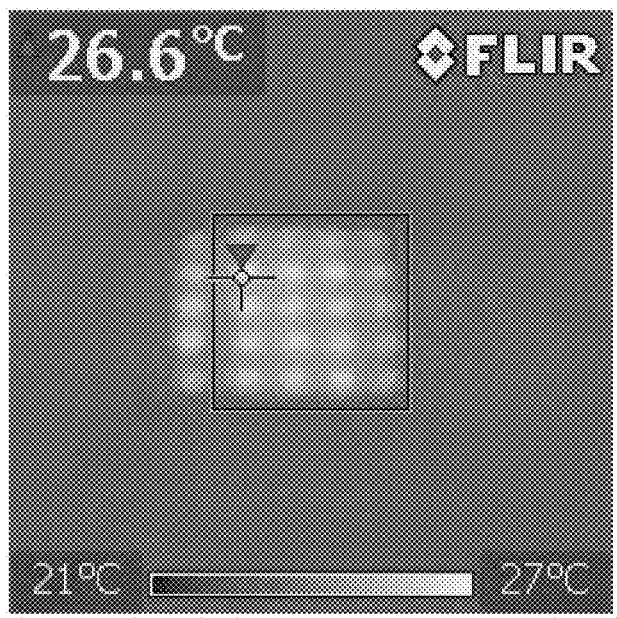
FIGS. 3A and 3B are thermal scans of an LED in a conventional package.
Figure 3B:
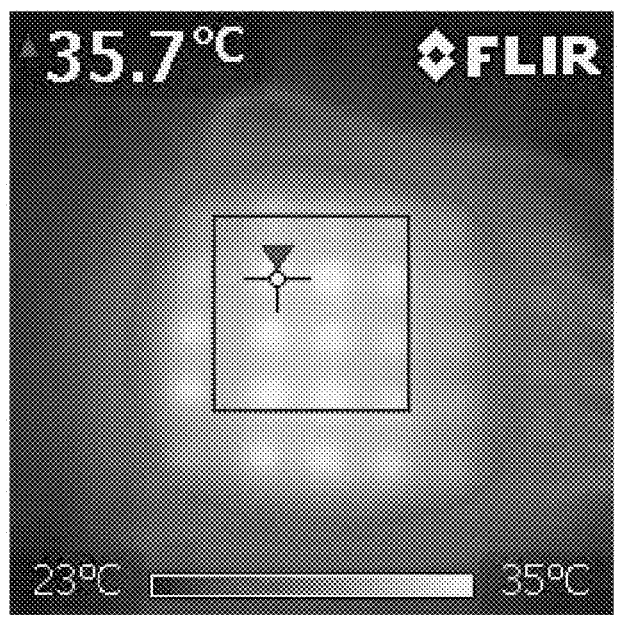
Figure 4A:
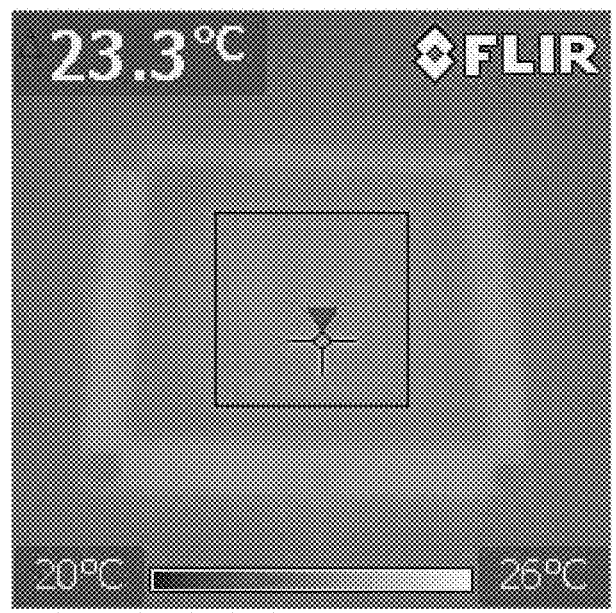
FIGS. 4A and 4B are thermal scans of a quantum dot chip on board according to the invention.
Figure 4B:
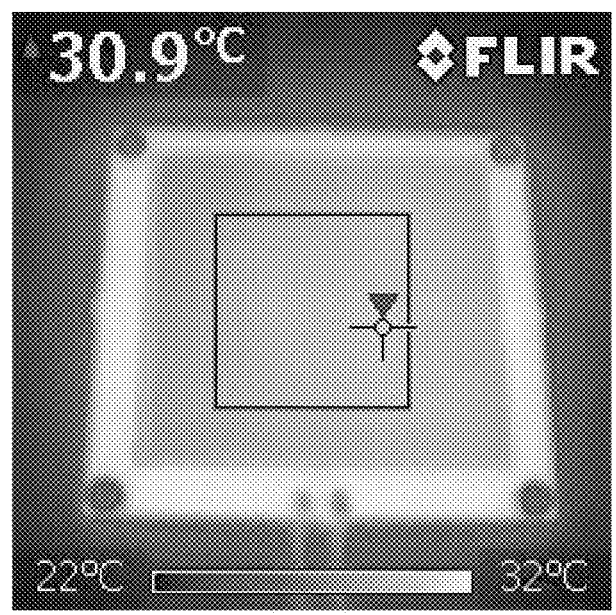

FIGS. 3A and 3B are infrared thermal scans of an LED in a conventional package. FIGS. 4A and 4B are infrared thermal scans of LED COB according to the invention. The COB was operated at 14.91v@98 mA; the conventional LED package (in the same layout as the COB) was operated at 14.6v@94 mA (this configuration will henceforth be referred to as "LED"). The COB produced 0.503 W radiant flux; the LED produced 0.51 W radiant flux.

As shown in FIG. 3A, the LED was at 26.6 degrees Celsius on initial turn on measured on the front face of film.

As shown in FIG. 4A, the COB exhibited 23.3 degrees Celsius on initial turn on measured on the front face of film.

After an hour operating time, the following results were observed: the LED face temperature had increased to 35.7 degrees Celsius, increasing by 9.1 degrees (FIG. 3B); and, the COB face temperature had increased to 30.9 degrees Celsius, increasing by 7.6 degrees (FIG. 4B).

Figure 5:
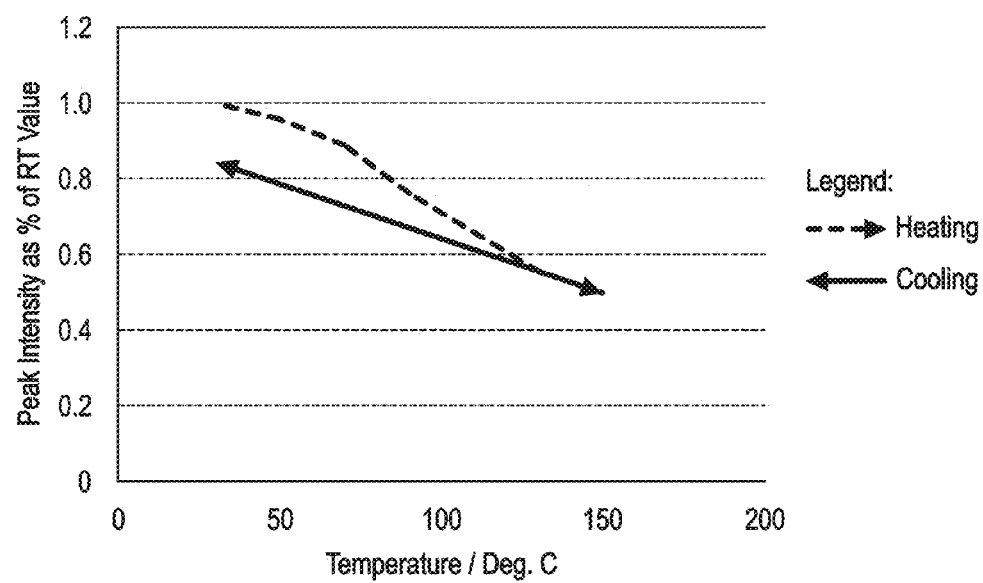
FIG. 5 is a graph showing the performance drop of quantum dots with increasing temperature.

These results suggest that greater stability of quantum dots may be obtained by using the dots in a COB format. As illustrated graphically in FIG. 5, there is a performance drop of quantum dots with increasing temperature (this data is representative only for previous studies with temperature derating).

It is important to maintain a relatively low operating temperature of quantum dots and the physical form of the COB allows for greater cooling therefore allowing the quantum dots to be moved closer to the end package and maintain a higher radiant flux than if one were to use a PCB populated with LEDs and a remote lens.

The physical characteristics of the COB suit the needs of the quantum dots and may be used as an encapsulation aid to reduce exposure to oxygen.

The principle this data shows is that using quantum dots in conjunction with a COB format aids the performance of the material as measured against traditional LED packages.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A light-emitting device comprising:
   a plurality of light emitting diodes (LEDs) in a chip on board configuration mounted on a printed circuit board (PCB);
   a thermal shield comprising a cylindrical ceramic ring surrounding the plurality of LEDs and having a first end and an opposing second end and attached at the first end to the PCB;
   a first encapsulant layer located within the cylindrical ring and encapsulating the plurality of light emitting diodes (LEDs);
   a quantum dot nanoparticle-containing layer disposed on the first encapsulant layer and in optical communication with the plurality of light emitting diodes (LEDs), the quantum dot nanoparticle-containing layer comprising a plurality of quantum dot nanoparticles suspended within a matrix material;
   a substantially transparent cap disposed on the second end of the cylindrical ring;
   a seal between the substantially transparent cap and the second end of the cylindrical ring; and
   a second encapsulant layer disposed between the quantum dot nanoparticle-containing layer and the substantially transparent cap.

2. The light-emitting device recited in claim 1 wherein the plurality of light emitting diodes (LEDs) are blue LEDs.

3. The light-emitting device recited in claim 1 wherein the plurality of quantum dot nanoparticles comprises red-emitting quantum dots and green-emitting quantum dots.

4. The light-emitting device recited in claim 1 further comprising a seal between the substantially transparent cap and the second end of the cylindrical ring.

5. The light-emitting device recited in claim 4 wherein the seal is a gas-tight seal.

6. The light-emitting device recited in claim 1 wherein the substantially transparent cap comprises a glass disk.

7. The light-emitting device recited in claim 1 wherein the quantum dot nanoparticles comprise a capping agent.

8. The light-emitting device recited in claim 7 wherein the capping agent comprises a Lewis base compound.

9. The light-emitting device recited in claim 8 wherein the Lewis base compound is selected from the group consisting of phosphines, phosphine oxides, alkyl phosphonic acids, alkylamines, aryl-amines, pyridines, long chain fatty acids and thiophenes.

10. The light-emitting device recited in claim 7 wherein the capping agent consists of a coordinated ligand that possesses a functional group that is polymerizable and has been used to form a polymer layer around the quantum dot nanoparticle.

11. The light-emitting device recited in claim 7 wherein the capping agent has an outermost layer that consists of organic units that are directly bonded to an outermost inorganic layer of the quantum dot nanoparticle.

12. The light-emitting device recited in claim 11 wherein the organic units that are directly bonded to an outermost inorganic layer of the nanoparticle are bonded via a disulfide bond between the inorganic surface and a thiol capping molecule.

13. The light-emitting device recited in claim 1 wherein the plurality of quantum dot nanoparticles are incorporated into a primary matrix material forming beads.

14. The light-emitting device recited in claim 13 wherein the primary matrix material is optically transparent.

15. The light-emitting device recited in claim 14 wherein the primary matrix material is selected from the group consisting of a resin, a polymer, a monolith, a glass, a sol gel, an epoxy, silicone, and (meth)acrylate.

16. The light-emitting device recited in claim 15 wherein the primary matrix material further comprises silica.

17. The light-emitting device recited in claim 1 wherein the first encapsulant layer comprises silicone.

18. The light-emitting device recited in claim 1 wherein the plurality of quantum dot nanoparticles are incorporated into a primary matrix and comprise an additional layer of an inorganic material on quantum dot-containing primary particles.

19. The light-emitting device recited in claim 18 wherein the additional layer of inorganic material comprises a metal oxide or a metal nitride.

* * * * *